United States Patent [19]

Geddes et al.

[11] Patent Number: 5,263,198
[45] Date of Patent: Nov. 16, 1993

[54] RESONANT LOOP RESISTIVE FET MIXER

[75] Inventors: John J. Geddes, Minneapolis; Paul E. Bauhahn, Fridley, both of Minn.

[73] Assignee: Honeywell Inc., Minneapolis, Minn.

[21] Appl. No.: 788,072

[22] Filed: Nov. 5, 1991

[51] Int. Cl.⁵ .................................................. H04B 1/28
[52] U.S. Cl. ..................................... 455/325; 455/333
[58] Field of Search .............. 455/325, 326, 323, 330, 455/327, 333; 307/579

[56] References Cited

U.S. PATENT DOCUMENTS

| | | | |
|---|---|---|---|
| 3,617,898 | 11/1971 | Janning | 455/333 |
| 3,716,730 | 2/1973 | Cerny | 455/333 |
| 4,160,213 | 7/1979 | Carter | 325/439 |
| 4,219,779 | 8/1980 | Shinkawa et al. | 455/325 |
| 4,308,473 | 12/1981 | Carnes | 307/529 |
| 4,327,445 | 4/1982 | Tanaka | 455/323 |
| 4,463,273 | 7/1984 | Dingwall | 307/579 |
| 4,592,095 | 5/1986 | Ohnishi et al. | 455/333 |
| 4,658,440 | 4/1987 | Pavie et al. | 455/324 |
| 4,896,374 | 1/1990 | Waugh et al. | 455/326 |
| 4,931,799 | 6/1990 | Wen et al. | 324/110 |
| 4,949,398 | 8/1990 | Maas | 455/326 |

FOREIGN PATENT DOCUMENTS

| | | | |
|---|---|---|---|
| 0198808 | 8/1989 | Japan | 455/333 |
| 0128506 | 5/1990 | Japan | 455/333 |

OTHER PUBLICATIONS

A GaAs MESFET Mixer with very low intermodulation, Stephen A. Maas, IEEE Transactions on Microwave Theory and Techniques, vol. MTT-35, No. 4, Apr. 1987, pp. 425-429.

Primary Examiner—Reinhard J. Eisenzopf
Assistant Examiner—Nguyen Vo
Attorney, Agent, or Firm—John G. Shudy, Jr.

[57] ABSTRACT

A mixer includes a local oscillator (LO) matching network having an LO input port, an RF matching network also having an input port and an IF filter which provides an IF output from the mixer. A FET having a gate, drain and source operates at the center of the mixer. A resonant loop is connected between the drain and gate of the FET. The gate of the FET is connected to an output of the LO matching network. The drain of the FET is connected to an output of the RF matching network. The source of the FET is connected to an input of the IF filter. The resonant loop may incorporate a DC blocking capacitor which does not function as part of the resonant loop, but which serves to block DC allowing the drain and gate of the FET to be biased independently.

9 Claims, 4 Drawing Sheets

RESONANT LOOP RESISTIVE FET MIXER

STATEMENT OF GOVERNMENT INTEREST

The invention described herein may be manufactured and used by or for the government of the United States for governmental purposes without the payment of royalty therefor.

BACKGROUND OF THE INVENTION

1. Field of the Invention

The field of this invention relates to devices which shift signals from one frequency to another. In particular, the invention provides a mixer which operates with frequencies in the microwave region and, more particularly, the mixer of the invention operates with a resonant loop to improve isolation between the local oscillator (LO) and RF ports in a resonant loop FET mixer.

2. Description of the Prior Art

FET based mixers have been investigated for many years with emphasis on active single or dual gate FET mixer designs. Drawbacks to the active FET mixer design include a high noise figure for dual gate designs and poor 1/f noise characteristics at low IF frequencies for both single and dual gate designs.

U.S. Pat. No. 4,949,398 to Maas is one example of a prior art mixer apparatus. The Maas '398 patent teaches a simple balanced-mixer circuit that uses the resistive channel of a GaAs Metal Semiconductor Field Effect Transistor (MESFET). The Maas '398 patent mixer employs dual MESFET's. The RF and IF signals are connected to the same FET terminals. While this approach is useful where the RF and LO frequencies are widely separated, it has now been found that, where the RF and LO frequencies are closely spaced, excellent isolation between the RF and local oscillator (LO) stages may be achieved with the use of a single FET mixer incorporating a resonant loop as taught by the present invention. In addition, the present invention, in contrast to the prior art, provides simplified IF filtering because the mixer of the present invention has the RF and IF signals connected to separate FET terminals.

Maas also describes a GaAs MESFET mixer in an article entitled "A GaAs MESFET Mixer with Very Low Intermodulation," IEEE Transactions on Microwave Theory and Techniques, Vol. MIT-35, No. 4, April 1987. Maas describes in some detail the small signal equivalent circuits of a MESFET in this article.

U.S. Pat. No. 4,308,473 to Carnes teaches a means for impressing a polyphase coded modulation on a transmitted signal and delayed replicas of such modulation on a bank of correlator/mixers. Each of the correlator/mixers include dual FETs as the active elements.

U.S. Pat. No. 4,896,374 to Waugh et al. provides a broadband monolithic balanced mixer apparatus. The '374 patent employs a common source FET with feedback for a signal splitter and a common gate FET for a combiner.

U.S. Pat. No. 4,160,213 to Carter provides a mixer injection voltage compensation apparatus. The '213 patent apparatus includes a varactor controlled LO and a FET arranged as a mixer.

U.S. Pat. No. 4,658,440 to Pavie et al. is another example of a mixer using dual FETs. The '440 patent provides a single balanced self-oscillating dual gate FET mixer which includes a dielectric resonator and two transmission lines inductively coupled to the resonator and to the second gates of the dual FETs.

U.S. Pat. No. 4,931,799 to Wen et al. provides a short-range radar transceiver employing a FET oscillator. The FET employed is varactor-tuned.

In contrast to the prior art it is an object of the present invention to provide a mixer using a single FET and resonant loop which exhibits excellent intermodulation performance at frequencies of about 35 GHz.

SUMMARY OF THE INVENTION

The present invention provides a unique passive FET single ended mixer design in which the LO signal is applied to the gate of a FET while the RF signal is applied to the drain. The IF signal is taken from the source of the FET. Since the IF frequency of the mixer is low, LO and RF frequencies cannot be readily separated by filtering. The design of the invention achieves isolation between the LO and RF ports by applying the LO and RF signals at different terminals of the FET. Coupling between the drain and the gate through the FET drain to source capacitance is minimized by forming a parallel resonant circuit with the FET capacitance. One embodiment of the invention has demonstrated an LO to RF isolation of 15 dB. In addition a MESFET based embodiment of the invention shows no measurable evidence of 1/f noise over an IF frequency range of 10 MHz to 100 MHz.

The present invention comprises a local oscillator (LO) matching network having an LO input port, an RF matching network also having an input port and an IF filter which provides an IF output from the mixer. A FET having a gate, drain and source operates at the center of the mixer. A resonant loop is connected between the drain and gate of the FET. The gate of the FET is connected to an output of the LO matching network. The drain of the FET is connected to an output of the RF matching network. The source of the FET is connected to an input of the IF filter. The resonant loop may incorporate a DC blocking capacitor which does not function as part of the resonant loop, but which serves to block DC allowing the drain and gate of the FET to be biased independently.

It is one object of the invention to provide a resonant loop resistive FET mixer having an isolation factor between the LO and RF ports of greater than 15 dB.

It is another example of the invention to provide a FET mixer design of reduced size and process compatibility with FET processes used in fabricating low noise amplifiers.

It is another object of the invention to provide a mixer with low 1/f noise as compared to conventional FET mixers which allows using the FET mixer in applications with a low IF frequency output.

Other features, advantages and objects of the invention will be apparent from the detailed description of the preferred embodiment, claims and drawings herein wherein like elements have like reference numerals.

DESCRIPTION OF THE PREFERRED EMBODIMENT

Figure 1:
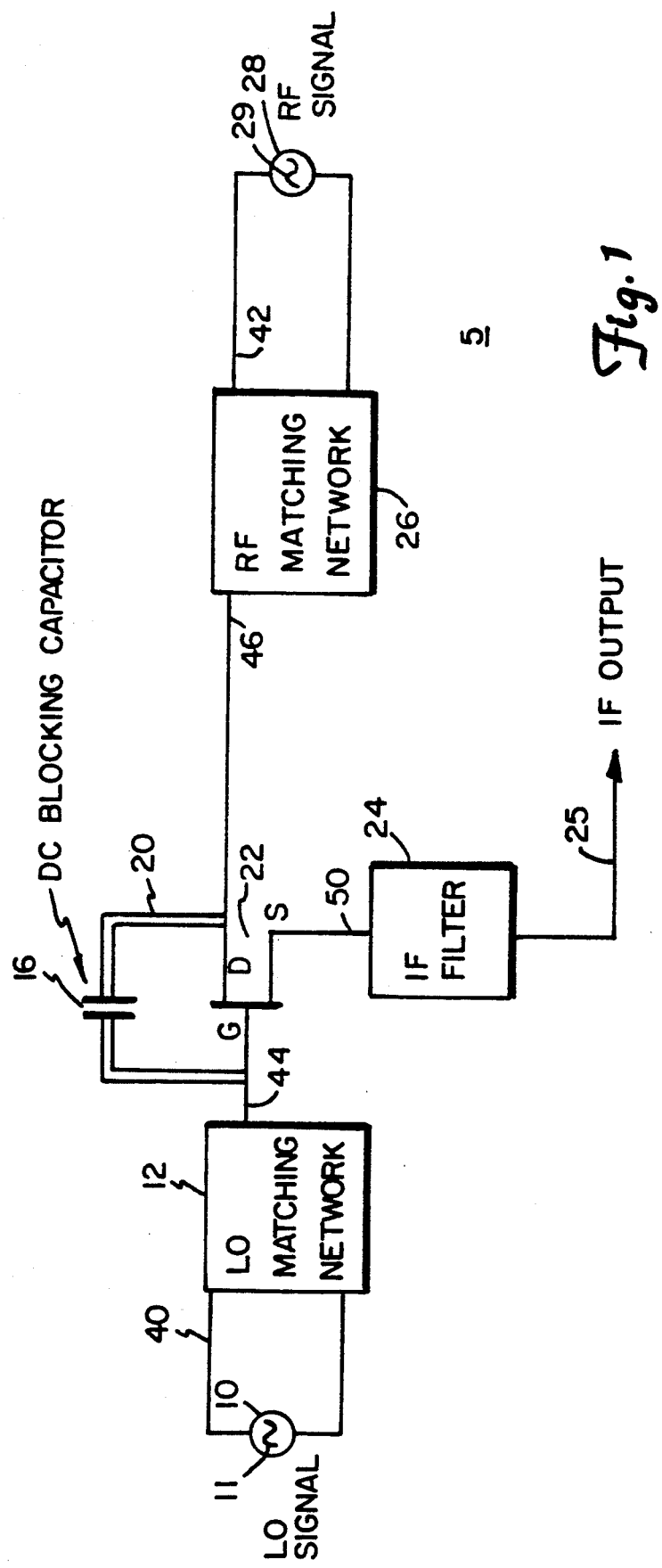
FIG. 1 shows a block diagram of one embodiment of a resonant loop resistive FET mixer of the invention.

Referring now to FIG. 1, a block diagram of one embodiment of the resonant loop resistive FET mixer is shown. The mixer 5 includes a local oscillator (LO) matching network 12, a resonant loop 20, a FET 22, an IF filter 24, an RF matching network 26, and a DC blocking capacitor 16. The LO matching network 12 and RF matching network 26 include input ports 40, 42 respectively, and output ports 44, 46 respectively. The output 44 of the LO matching network 12 is connected to the gate of FET 22. The output 46 of the RF matching network 26 is connected to the drain of FET 22. A resonant loop 20 is connected between the drain and gate of the FET 22. A blocking capacitor 16 may be connected within the resonant loop 20, although it does not function as part of the resonant loop. The blocking capacitor 16 is present to allow the FET 22 drain and gate to be biased with different voltages. The source of the FET 22 is connected to an input 50 of IF filter 24. The IF filter 24 includes an IF output 25 to provide the mixed signal. An LO signal 11 may be provided by an external LO source 10 connected to the LO matching network input port 40. Similarly, an RF signal 29 may be provided as an input to the RF matching network 26 at the input port 42.

Figure 2:
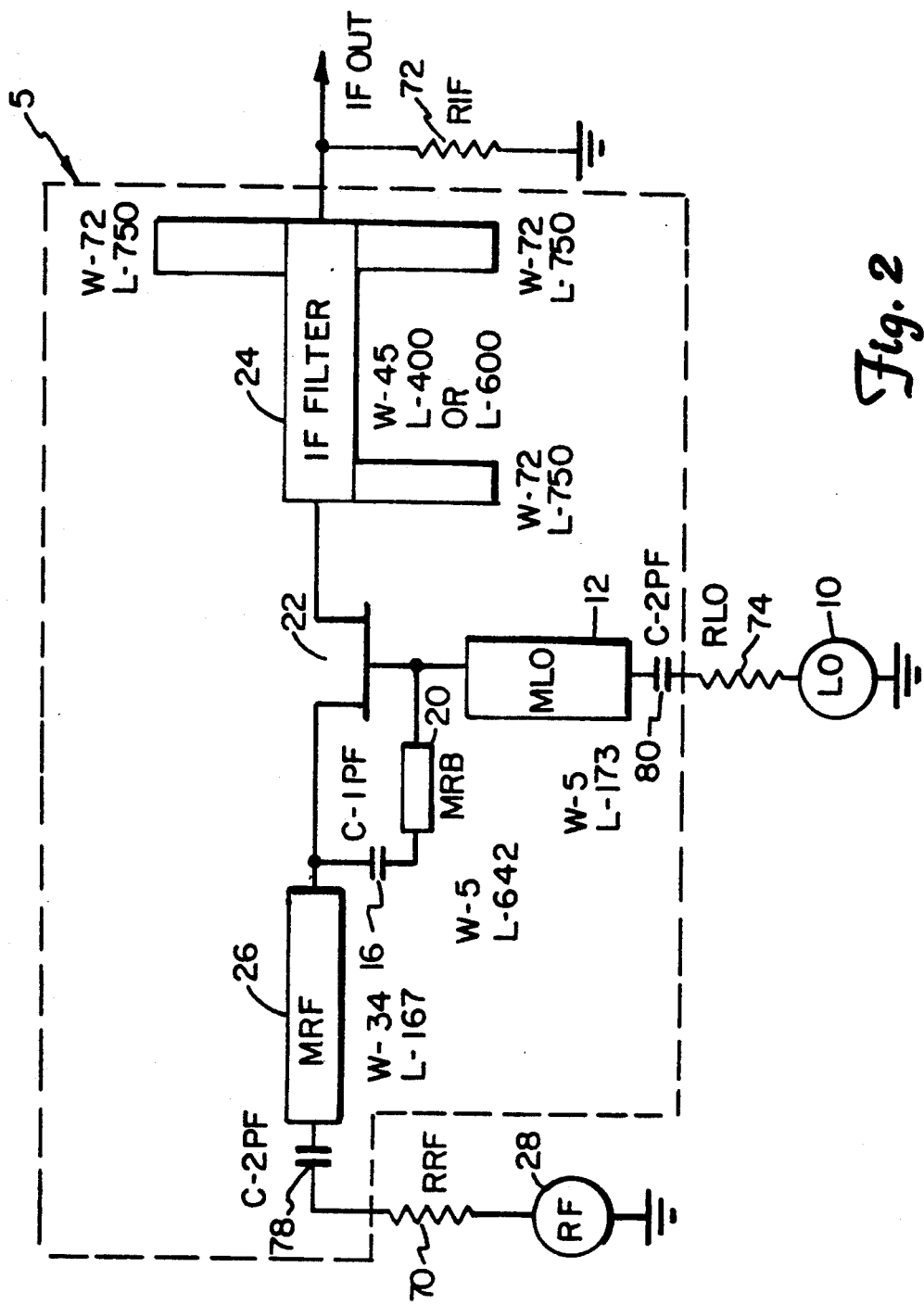
FIG. 2 shows a more detailed schematic circuit diagram of one embodiment of the resonant loop resistive FET mixer of the invention.

Now referring to FIG. 2, a more detailed circuit diagram of the resonant loop resistive FET mixer of the invention is shown. Included in FIG. 2 are the RF source 28 and is internal resistance 70, $R_{rf}$, the local oscillator source 10 and its internal resistance 74, $R_{lo}$, and the IF output impedance 72, $R_{if}$. Also shown in the more detailed schematic of FIG. 2 are coupling capacitors 78 and 80. Coupling capacitor 78 is connected between the RF matching network 26 and the RF source internal resistance 70. Coupling capacitor 80 is connected between the local oscillator source 10 and the LO matching network 12. The coupling capacitors 78, 80, in one example of the invention constructed by Honeywell Inc. of Minneapolis, Minn., have a capacitance of about 2 pF. The blocking capacitor 16 has a capacitance of about 1 pF. FET 22 includes internal capacitances and resonant loop means 20 comprises a length of transmission line selected to resonate with the internal FET 22 capacitances so as to provide RF port 42 to LO port 40 isolation of greater than about 15 dB at LO frequencies above about 32 GHz and below about 36 GHz. Also shown in FIG. 2 are example widths, W, and lengths, L, of microstrip line used in this example of the invention. For example, the resonant loop 20 comprises a transmission line having a width of about 5 microns and a length of about 642 microns.

Figure 3:
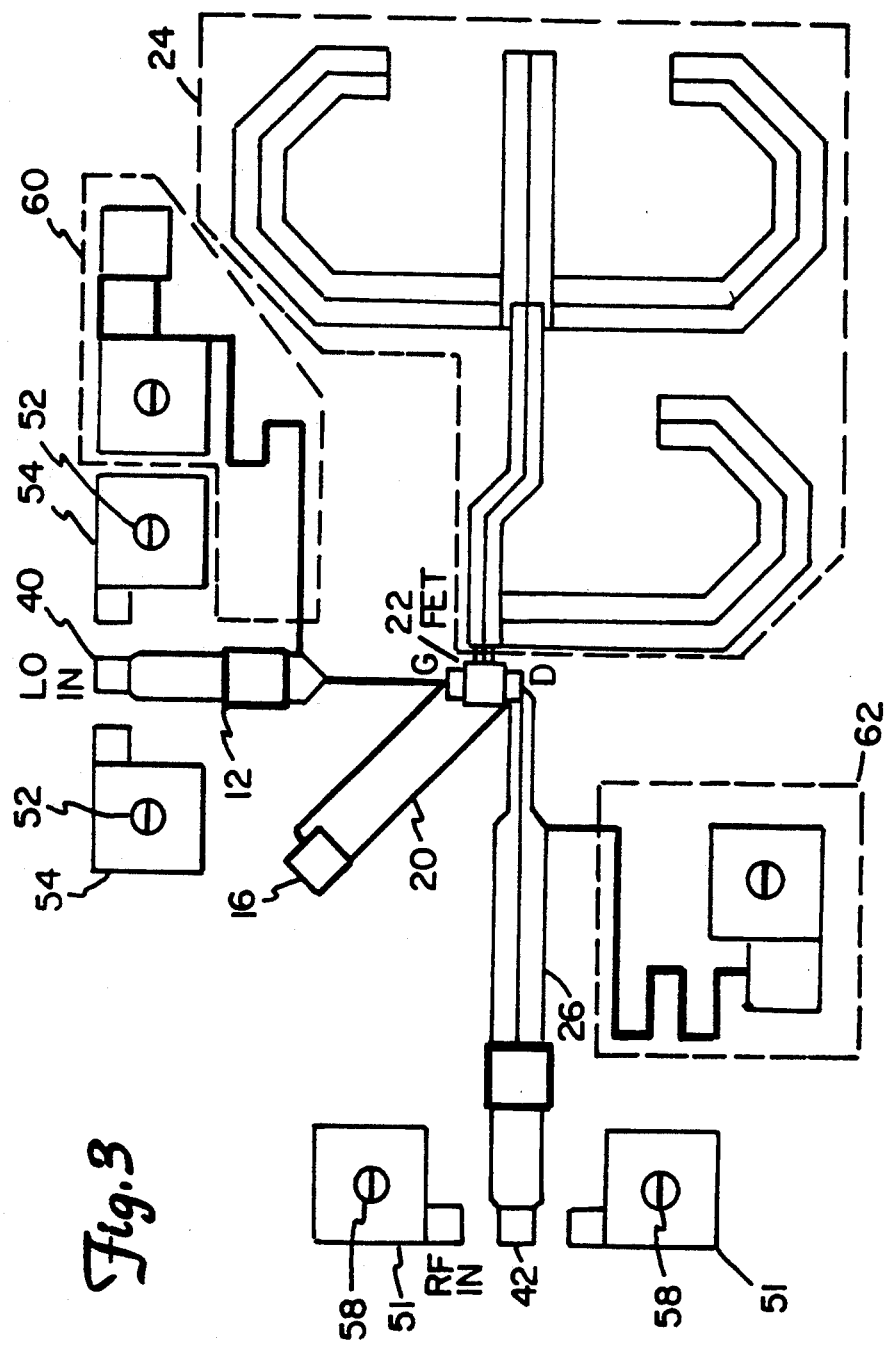
FIG. 3 shows an integrated circuit layout for one embodiment of the invention.

Referring now to FIG. 3, an integrated circuit layout of one example of a resistive FET mixer of the invention is shown as designed for operation at a frequency of about 35 GHz. This layout may be implemented in GaAs material having, for example, a plurality of layers, including a ground plane layer which may comprise, for example, a metal such as gold. Integrated circuit construction is well known in the art. In this example, the DC blocking capacitor may be a 1.0 pF capacitor fabricated as two gold layers with a layer of Silicon Nitride juxtaposed there between. For testing purposes RF input probes 51 including vias 58 to the ground plane (not shown) are included adjacent the RF input port 42. Similarly, testing pads 54 having vias 52 are incorporated adjacent the LO input port 40. These extra large pads 51, 54 are for the application of test probes, as will be appreciated by those skilled in the art. Also shown is the microstrip layout of the IF network 24, the resonant loop 20, including the blocking capacitor 16 and the FET 22. Connections are as described above. The input impedances of the LO and RF ports are matched for 50 OHM input impedances. Those skilled in the art will recognize that other matching impedances, such as 75 OHMs may be used and that the values recited herein are for purposes of illustration and not by way of limitation of the invention.

Also shown in detail in FIG. 3 are bias decoupling features 60, 62 for the FET 22. The microstrip lines 60 function as bias decoupling for the FET gate. The microstrip lines 62 function as bias decoupling for the FET drain. In this example, the FET 22 is advantageously a MESFET. The equivalent circuit and internal capacitances of such a FET is described in detail in the aforereferenced U.S. Pat. No. 4,949,398 to Maas. Those skilled in the art will recognize that other equivalent devices may also be employed to achieve the results of this invention.

Figure 4:
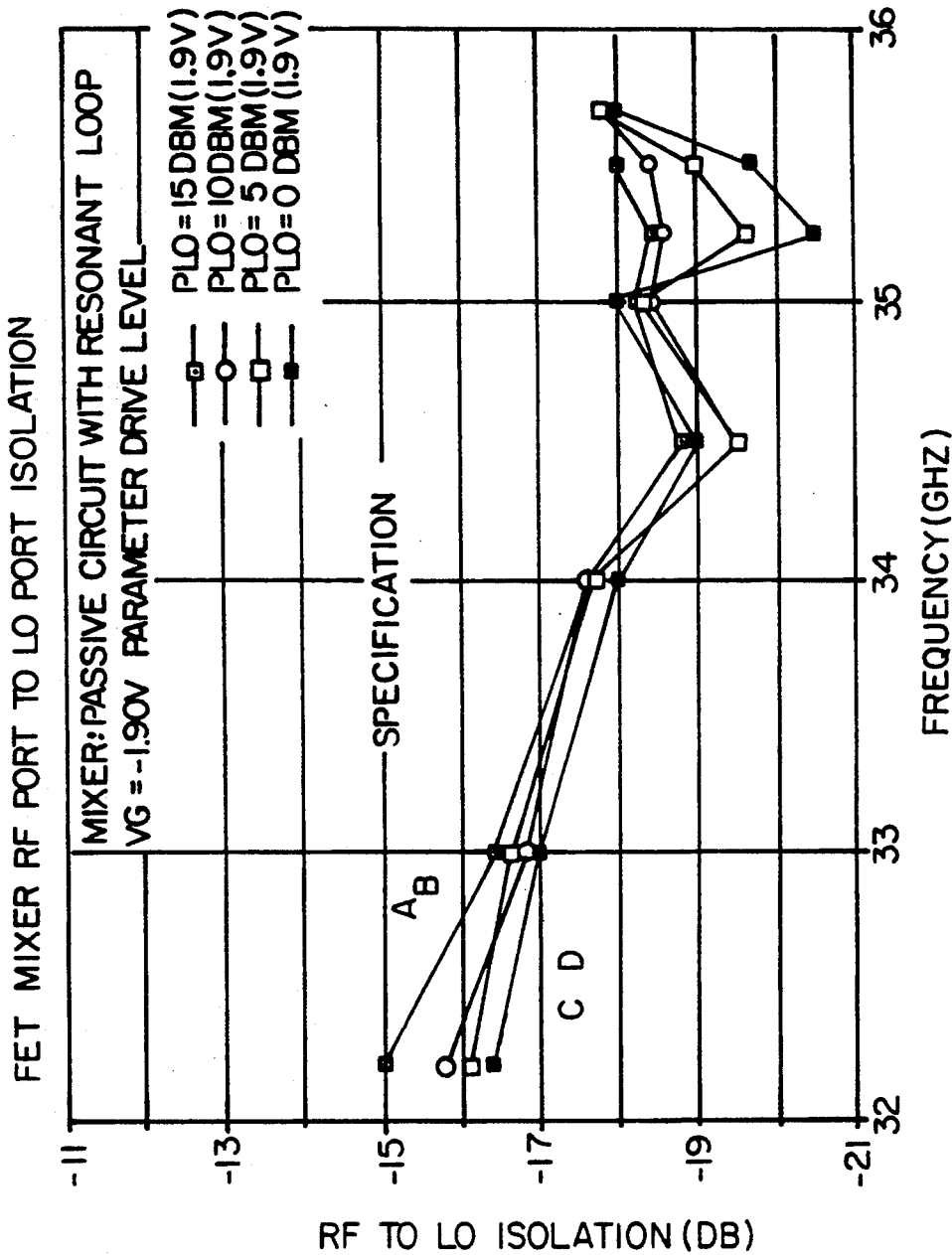
FIG. 4 graphically illustrates the excellent isolation between the LO and RF stages achieved with an example model of the invention.

Now referring to FIG. 4, RF port to LO port isolation data is shown there graphically. The horizontal axis represents frequency in GHz and the vertical axis represents the RF to LO isolation in decibels (dB). The frequencies tested are in the range of about 32-36 GHz where it can be seen that isolation between the RF and LO ports range from −15 dB to about −20 dB. Four curves, A, B, C and D are shown which correspond to LO drive levels of 15 dbm, 10 dbm, 5 dbm and 0 dbm respectively at a gate voltage of −1.9 volts.

In operation, the blocking capacitor 16 prevents shorting of the FET drain to gate. In the aforereferenced example, the drain of the FET mixer is biased at zero volts. The gate is biased with negative gate voltage to a value somewhat less negative than the pinch-off voltage for maximum transconductance.

The invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

For example, both MESFET and HEMT versions of the mixer of the invention have been fabricated using a hybrid stepper/e-beam lithography process on three inch wafers. The MESFET version used a $Si^{29}$ implant at 100 keV with a $7e^{12} cm^{-3}$ dose for channel doping and a buried $Be^9$ implant at 80 keV with a dose of $6e^{11} cm^{-3}$ to improve the implant profile. The HEMT version is a standard $Al_xGa_{1-x}As/GaAs$ structure with an x value of 0.22. Backside processing includes thinning a wafer to 4 mils, reactive ion etching of through substrate via holes, and backside gold plating and etching of streets in the gold plating for chip separation.

What is claimed is:

1. A resonant loop resistive mixer apparatus comprising:

means for operating as a field effect transistor (FET) having a source, a drain and a gate;

means for operating as a local oscillator (LO) matching network including an LO port and having an output connected to the FET gate;

means for operating as an RF matching network including an RF port and having an output connected to the FET drain;

means for operating as a resonant loop connected between the FET drain and gate; and means for operating as an IF filter having an input connected to the FET source; and wherein the FET includes internal capacitances and the resonant loop means comprises a length of transmission line selected to resonate with the internal FET capacitances so as to provide RF port to LO port isolation of greater than about 15 dB.

2. The apparatus of claim 1 wherein the FET means comprises a GaAs Metal Semiconductor Field Effect Transistor (MESFET).

3. The apparatus of claim 1 wherein the resonant loop means further includes a DC blocking capacitor.

4. The apparatus of claim 1 further comprising:
a. a gate bias decoupling network means connected to the FET gate; and
b. a drain bias decoupling means connected to the FET drain. means for operating as an IF filter having an input connected to the FET source; and wherein the FET includes internal capacitances and the resonant loop means comprises a length of transmission line selected to resonate with the internal FET capacitances so as to provide RF port to LO port isolation of greater than about 15 dB.

5. A resonant loop resistive mixer apparatus comprising:

a field effect transistor (FET) having a source, a drain and a gate wherein the FET comprises a GaAs Metal Semiconductor Field Effect Transistor (MESFET);

a local oscillator (LO) matching network having an output connected to the FET gate;

an RF matching network having an output connected to the FET drain;

a resonant loop connected between the FET drain and gate wherein the resonant loop means further includes a DC blocking capacitor;

an IF filter having an input connected to the FET source;

a gate bias decoupling network means connected to the FET gate; and a drain bias decoupling means connected to the FET drain; and wherein the FET includes internal capacitances and the resonant loop means comprises a length of transmission line selected to resonate with the internal FET capacitances so as to provide RF port to LO port isolation of greater than about 15 dB.

6. A resonant loop resistive mixer apparatus comprising:

a field effect transistor (FET) having a source, a drain and a gate wherein the FET comprises a GaAs Metal Semiconductor Field Effect Transistor (MESFET);

a local oscillator (LO) providing an LO signal;

a local oscillator matching network including an LO port coupled to receive the LO signal and having an output connected to the FET gate;

an RF signal generator providing an RF signal;

an RF matching network including an RF port coupled to receive the RF signal and having an output connected to the FET drain;

a resonant loop connected between the FET drain and gate wherein the resonant loop means further includes a DC blocking capacitor;

an IF filter having an input connected to the FET source;

a gate bias decoupling network means connected to the FET gate; and a drain bias decoupling means connected to the FET drain; and wherein the FET includes internal capacitances and the resonant loop means comprises a length of transmission line selected to resonate with the internal FET capacitances so as to provide RF port to LO port isolation of greater than about 15 dB at LO frequencies above about 32 GHz and below about 36 GHz.

7. A resonant loop resistive mixer apparatus comprising:

means for operating as a field effect transistor (FET) having a source, a drain and a gate;

means for operating as a local oscillator (LO) matching network including an LO port and having an output connected to the FET gate;

means for operating as a radio frequency (RF) matching network including an RF port and having an output connected to the FET drain;

means for operating as a resonant loop connected between the FET drain and gate, wherein the FET includes internal capacitances and the resonant loop means comprises an inductance selected to resonate with the internal FET capacitances so as to increase RF port to LO port isolation; and means for operating as an intermediate frequency (IF) filter having an input connected to the FET source.

8. A resonant loop resistive mixer apparatus comprising:

a field effect transistor (FET) having a source, a drain and a gate;

a local oscillator (LO) matching network having an output connected to the FET gate;

an RF matching network having an output connected to the FET drain;

a resonant loop connected between the FET drain and gate, wherein the FET includes internal capacitances and the resonant loop comprises an inductance selected to resonate with the internal FET capacitances so as to increase RF port to LO port isolation; and an IF filter having an input connected to the FET source.

9. A resonant loop resistive mixer apparatus comprising:

a transistor having first, second and third terminals;

a local oscillator (LO) matching network having an output connected to the first terminal;

a radio frequency (RF) matching network having an output connected to the second terminal;

a resonant loop connected between the first and second terminals, wherein the transistor has an internal capacitance and the resonant loop comprises an inductance selected to resonate with the internal transistor capacitance; and an intermediate frequency (IF) filter having an input connected to the third terminal.

* * * * *

UNITED STATES PATENT AND TRADEMARK OFFICE
CERTIFICATE OF CORRECTION

PATENT NO. : 5,263,198
DATED : November 16, 1993
INVENTOR(S) : John J. Geddes, Paul E. Bauhahn It is certified that error appears in the above-indentified patent and that said Letters Patent is hereby corrected as shown below:

Column 5, line 27, after "drain." cancel --means for operating as an IF filter having an input connected to the FET source; and wherein the FET includes internal capacitances and the resonant loop means comprises a length of transmission line selected to resonate with the internal FET capacitances so as to provide RF port to LO port isolation of greater than about 15 dB.--

Signed and Sealed this

Thirty-first Day of October 1995

Attest:

BRUCE LEHMAN

Attesting Officer

Commissioner of Patents and Trademarks